(12) United States Patent
Watanabe et al.

(10) Patent No.: US 8,518,290 B2
(45) Date of Patent: Aug. 27, 2013

(54) PIEZOELECTRIC MATERIAL

(75) Inventors: Takayuki Watanabe, Kawasaki (JP); Takanori Matsuda, Chofu (JP); Hiroshi Saito, Yokohama (JP); Hiroshi Funakubo, Yokohama (JP); Nobuhiro Kumada, Kofu (JP); Takashi Iijima, Tsukuba (JP); Bong-Yeon Lee, Tsukuba (JP)

(73) Assignees: Canon Kabushiki Kaisha, Tokyo (JP); University of Yamanashi, Kofu-Shi (JP); Tokyo Institute of Technology, Tokyo (JP); National Institute of Advanced Industrial Science and Technology, Tokyo (JP)

( * ) Notice: Subject to any disclaimer, the term of this patent is extended or adjusted under 35 U.S.C. 154(b) by 532 days.

(21) Appl. No.: 12/509,043

(22) Filed: Jul. 24, 2009

(65) Prior Publication Data

US 2010/0025618 A1    Feb. 4, 2010

(30) Foreign Application Priority Data

Jul. 30, 2008  (JP) ................................. 2008-196902

(51) Int. Cl.
  C04B 35/495  (2006.01)
  C04B 35/00   (2006.01)
  H01L 41/187  (2006.01)
  H01L 41/18   (2006.01)
  C09K 5/00    (2006.01)

(52) U.S. Cl.
  USPC ............................... 252/62.9 R; 252/62.9 PZ

(58) Field of Classification Search
  USPC ....................... 252/62.9 PZ, 62.9 R
  See application file for complete search history.

(56) References Cited

U.S. PATENT DOCUMENTS

| | | | |
|---|---|---|---|
| 5,011,796 A * | 4/1991 | Bridger et al. ................. | 501/12 |
| 6,541,279 B2 * | 4/2003 | Hayashi et al. ................. | 438/3 |
| 7,381,671 B2 | 6/2008 | Ogiso | |
| 7,525,239 B2 | 4/2009 | Aoki et al. | |
| 7,674,738 B2 * | 3/2010 | Kubota ........................ | 501/135 |
| 2006/0045840 A1 | 3/2006 | Chen et al. | |
| 2006/0172880 A1 | 8/2006 | Shirakawa et al. | |
| 2007/0161497 A1 | 7/2007 | Ogiso | |
| 2009/0315432 A1 | 12/2009 | Furuta et al. | |
| 2010/0081559 A1 | 4/2010 | Zhang et al. | |

FOREIGN PATENT DOCUMENTS

| | | | |
|---|---|---|---|
| JP | 2004-075448 A | | 3/2004 |
| JP | 2006-151796 A | | 6/2006 |
| WO | 2005/075378 A1 | | 8/2005 |
| WO | WO2007/139060 | * | 12/2007 |
| WO | 2009/116683 A1 | | 9/2009 |

OTHER PUBLICATIONS

Wakiya. Synthesis and Dielectric Properties of Ba1-xR2x/3Nb2O6 (R: Rare Earth) with Tetragonal Tungsten Bronze Structure. J. Euro. Ceram. Soc. 19 1999 (1071-1075).*

John R. Oliver et al., "Ferroelectric Properties of Tungsten Bronze Morphotropic Phase Boundary System," 72(2) J. Am. Ceram. Soc. 202-11 (Feb. 1989).

U.S. Appl. No. 12/889,684, filed Sep. 24, 2010.
U.S. Appl. No. 12/922,824, filed Mar. 18, 2009.
U.S. Appl. No. 12/700,381, filed Feb. 4, 2010.
U.S. Appl. No. 12/627,291, filed Nov. 30, 2009.
U.S. Appl. No. 12/639,473, filed Dec. 16, 2009.
U.S. Appl. No. 12/508,968, filed Jul. 24, 2009.

* cited by examiner

*Primary Examiner* — Carol M Koslow
*Assistant Examiner* — Matthew E Hoban
(74) *Attorney, Agent, or Firm* — Fitzpatrick, Cella, Harper & Scinto

(57) ABSTRACT

Provided is a piezoelectric material which includes a compound free of lead and alkali metal and has a good piezoelectric property. The piezoelectric material where tungsten bronze structure oxides being free of lead and alkali metal and represented by $A_xB_{10}O_{30}$ and $A'_xB'_{10}O_{30}$ are combined to form a morphotropic phase boundary has good piezoelectric property. The $A_xB_{10}O_{30}$ is $b(Ba_{5-5\alpha}Bi_{10\alpha/3}Nb_{10}O_{30})+(1-b)(Ba_4Ag_2Nb_{10}O_{30})$ ($0 \leq b \leq 1$ and $0 < \alpha \leq 0.4$), and the $A'_xB'_{10}O_{30}$ is $c(Sr_5Nb_{10}O_{30})+d(Ca_5Nb_{10}O_{30})+e(Ba_5Nb_{10}O_{30})$ ($0 \leq c \leq 0.8$, $0 \leq d \leq 0.4$, $0.1 \leq e \leq 0.9$, and $c+d+e=1$).

8 Claims, 2 Drawing Sheets

PIEZOELECTRIC MATERIAL

BACKGROUND OF THE INVENTION

1. Field of the Invention

The present invention relates to a metal oxide with piezoelectric characteristics having a novel composition. In particular, the present invention relates to a piezoelectric material containing neither lead nor an alkali metal and having a tungsten bronze structure.

2. Description of the Related Art

Piezoelectric materials are widely utilized in applications such as actuators, ultrasonic vibrators, ultrasonic motors, surface acoustic wave filters, and high voltage generators. The piezoelectric material mainly used in them is PZT [Pb(Zr,Ti)$O_3$, lead zirconate titanate] which has a perovskite structure and contains lead. Thus, in view of environmental problems, lead-free piezoelectric materials have been developed.

A major reason why the above PZT is used widely is because a composition referred to as a morphotropic phase boundary (MPB) which markedly enhances the piezoelectric property is present. In the case of PZT, the crystal system takes a form of either tetragonal or rhombohedral structure depending on the ratio of zirconium and titanium, and their boundary in the crystal system is described to be generally near Ti/(Zr+Ti)=0.48. The piezoelectric constant of PZT increases several times near this morphotropic phase boundary. Therefore, in the development of the lead-free piezoelectric materials, it is important how a material system capable of forming a morphotropic phase boundary which enhances the piezoelectric property is developed.

In tungsten bronze structure oxides, a possibility has been shown that a morphotropic phase boundary is formed by mutually dissolving tungsten bronze structure oxides where symmetry of crystals is different even when the crystal systems are the same.

According to Journal of American Ceramic Society, Volume 72, pages 202 to 211 (1989), as a lead-free tungsten bronze MPB composition, (1-X)$Ba_2NaNb_5O_{15}$—X$Sr_2NaNb_5O_{15}$ has been reported, but (1-X)$Ba_2NaNb_5O_{15}$—X$Sr_2NaNb_5O_{15}$ contains an alkali metal.

WO2005/075378 describes a tungsten bronze structure oxide containing neither lead nor alkali metal, but there is no description on the crystal system and the MPB.

As described above, no tungsten bronze structure piezoelectric material, which has MPB and contains neither lead nor alkali metal, has been ever known.

Furthermore, WO2005/075378 describes a tungsten bronze type ferroelectric material represented by $(Ba_{1-x-y}Sr_xCa_y)_2Ag_{1-d}Nb_5O_{15-2/d}$ ($0.1 \leq x+y \leq 0.8$, $0 \leq d \leq 0.6$). In this case, when d is 0<d, the total formal charges of the cations is always less than +30. Thus, this is the structure in which the charges can not be balanced unless oxygen is always deficient.

When d is 0, the formula is $(Ba_{1-x-y}Sr_xCa_y)_2AgNb_5O_{15}$. This is obtained by substituting a part of Ba in $Ba_2AgNb_5O_{15}$ with either one or more of Sr or Ca which has the same valence, and because of $0.1 \leq x+y \leq 0.8$, the molar amount of Ba is always less than two times of Ag.

The conventional piezoelectric materials containing lead or alkali metals have two issues. One is the high environmental load attributed to the toxicity of lead, and the other issue is the troubles related with the alkali metals upon producing devices. Due to the high diffusion coefficient and high vapor pressure of the alkali metals, it is difficult to obtain piezoelectric ceramics with a high composition uniformity and a high density.

SUMMARY OF THE INVENTION

The present invention has been accomplished in the light of such background art, and provides a piezoelectric material with good piezoelectric characteristics, which includes a tungsten bronze structure oxide containing neither lead nor alkali metal element in its composition, and has a morphotropic phase boundary.

The piezoelectric material, which solves the above problems, includes a tungsten bronze structure oxide represented by the following general formula (1), in which the tungsten bronze structure oxide forms a morphotropic phase boundary:

$$A_xB_{10}O_{30})-(1-a)(A'_{x'}B'_{10}O_{30}) \quad \text{General Formula (1):}$$

In the formula, A represents at least one metal selected from alkali earth metals, bismuth, and silver; A' represents at least one element selected from Group II elements, Group III elements (including lanthanoid), bismuth, and silver; B and B' each represent at least one element selected from magnesium, transition elements in Group III to Group XI, zinc, typical metal elements in Group XIII, and tin; and a represents $0<a<1$, x represents $4 \leq x \leq 6$, and x' represents $4 \leq x' \leq 6$ and $4 \leq ax+(1-a)x'<6$.

According to the present invention there can be provided a piezoelectric material with good piezoelectric characteristics, which includes a tungsten bronze structure oxide containing neither lead nor alkali metal element in its composition, and has a morphotropic phase boundary.

Further features of the present invention will become apparent from the following description of exemplary embodiments with reference to the attached drawings.

DESCRIPTION OF THE EMBODIMENTS

Figure 1:
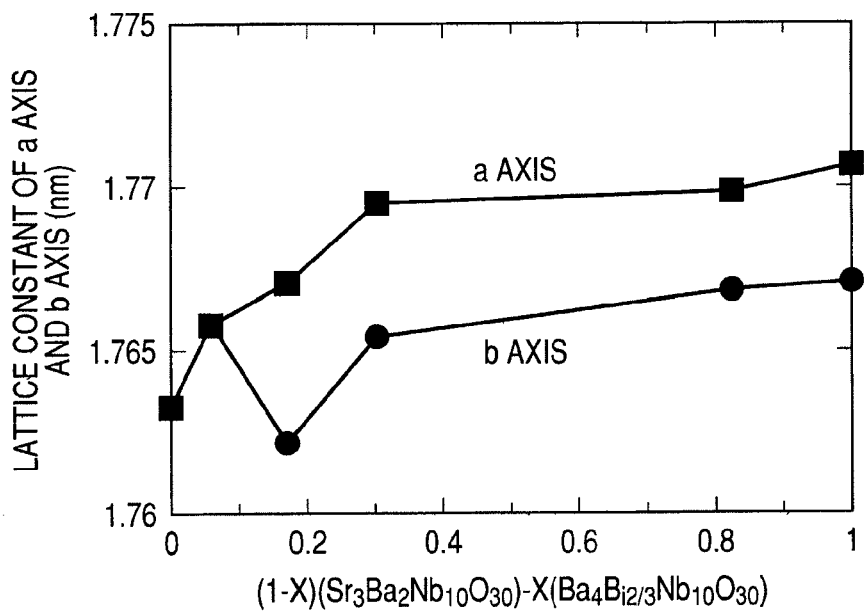
FIG. 1 is a graphical representation illustrating lattice constants of (1-X)$Sr_3Ba_2Nb_{10}O_{30}$—X($Ba_4Bi_{2/3}Nb_{10}O_{30}$) thin films at room temperature.

The present invention is described in detail below. Hereinafter, a metal oxide of the present invention is described consistently as a piezoelectric material, but the metal oxide of the present invention may be used for not only the piezoelectric devices but also other applications such as capacitors by utilizing its characteristics as a dielectric material.

Tungsten Bronze Structure Oxide of the Present Invention

The piezoelectric material in the present invention includes an $(AA')_x(BB')_{10}O_{30}$ type tungsten bronze structure oxide, which is represented by the following general formula (1), and forms a morphotropic phase boundary.

$$a(A_xB_{10}O_{30})-(1-a)(A'_{x'}B'_{10}O_{30}) \quad \text{General Formula (1)}$$

In the above formula, A represents at least one metal selected from alkali earth metals, bismuth, and silver; A' represents at least one element selected from Group II elements, Group III elements (including lanthanoid), bismuth, and silver; B and B' each represent at least one element selected from magnesium, transition elements in Group III to Group XI, zinc, typical metal elements in Group XIII, and tin; and a represents $0<a<1$, x represents $4 \leq x \leq 6$, and x' represents $4 \leq x' \leq 6$.

In the above general formula (1), A and A', and B and B' are not equal simultaneously.

In $a(A_xB_{10}O_{30})$-$(1-a)(A'_xB'_{10}O_{30})$, $4 \leq ax+(1-a)x'<6$ is favorable. Because a pure tungsten bronze structure phase is easily obtained in this composition range. Also because in the case of $ax+(1-a)x'=6$, even in the composition near the morphotropic phase boundary, the piezoelectric property is lower than that in the other compositions in some cases, which is not preferable.

The present invention is the tungsten bronze structure oxide including the above $A_xB_{10}O_{30}$ and $A'_xB'_{10}O_{30}$ in combination. By this combination, the latitude in a sintering condition is expanded, and a ceramic body having a relative sintered density of 90% or more is easily obtained in a wide range of temperatures. Furthermore, in a morphotropic phase boundary region by the above combination, the characteristics are further enhanced, which is more preferable.

Generally, the term "morphotropic phase boundary" refers to a boundary where the crystal system of a solid solution varies depending on the composition. Furthermore, in the tungsten bronze structure, the morphotropic phase boundary includes the boundary where the space group of the solid solution varies depending on the composition Generally in the vicinity of the morphotropic phase boundary, the lattice constant is not changed in accordance with Vegard's law. Likewise, the relative permittivity, Curie point, piezoelectric performance, a coercive electric field of hysteresis loop of electric field-polarization, and Young's modulus do not follow the linear relationship, which is given by connecting physical properties of end components in a solid solution system. The composition dependency of those physical properties exhibits a maximum value, a minimum value, or an inflection point in the vicinity of the morphotropic phase boundary.

From the foregoing, the morphotropic phase boundary is defined as follows in the present invention. The composition region in which the space group or the crystal system varies depending on the composition, or alternatively any one of the lattice constant, the relative permittivity, Curie point, the piezoelectric performance, the coercive electric field of hysteresis loop of electric field-polarization, and Young's modulus exhibits any one of a maximum value, a minimum value, and an inflection point in the solid solution of the tungsten bronze structure oxide is defined as the morphotropic phase boundary. More strictly, the vicinity of a common composition in which at least two physical properties exhibit any one of a maximum, a minimum, and an inflection point is defined as the morphotropic phase boundary.

In the morphotropic phase boundary, the crystal system is not always changed from one to the other immediately. As observed in PZT, since the crystal systems of the end components coexist in the morphotropic phase boundary region in some cases, or since a third crystal system appears in the vicinity of the morphotropic phase boundary region in some cases, there is a range in the morphotropic phase boundary.

The composition range including a position and a width of the morphotropic phase boundary is predicted to vary depending on the material, and can not be primarily determined.

The piezoelectric material where the morphotropic phase boundary is formed in the tungsten bronze structure oxide in the present invention indicates the entire solid solution having the morphotropic phase boundary as described above. Preferable is, for example, 20% around the composition, which gives the maximum value of the relative permittivity. For example, when the morphotropic phase boundary is in $a=0.6$ (a indicates a in the general formula (1)), the composition range of $0.4 \leq a \leq 0.8$ which is 20% around that is preferable.

The piezoelectric material of the present invention may be a film form being in contact with a substrate material or may be a sintered body, which is not supported by the substrate material. In the case of the film, an electrode layer may be provided between the substrate and the piezoelectric material of the present invention, or the substrate material may also serve as an electrode. The sintered body is also electroded when made into a device. Those electrodes may be provided on and under the piezoelectric material, or only one side may be electroded with, for example, comb electrodes.

The film of the piezoelectric material may be produced by a reactive high-frequency magnetron sputtering process. The film may also be produced by technologies such as a chemical vapor deposition (CVD) process, a pulsed laser deposition (PLD) process, a molecular beam epitaxy (MBE) process, a sol-gel process, and a chemical solution decomposition (CSD) process.

The sintered body of the piezoelectric material can be obtained by using conventional sintering methods. Raw material powders such as carbonates, nitrates, and oxides are weighed, mixed and subsequently calcined at 700 to 1,400° C. for 1 to 12 hours. The calcined powder is pulverized, granulated, molded, and sintered at 800 to 1,400° C. for 1 to 12 hours. Since the piezoelectric material of the present invention contains no alkali metal, a sintered body free from any impurity phase was obtained reproducibly.

The shape of the sintered tungsten bronze structure oxide, which forms the morphotropic phase boundary, is granular or lamellar. The preferable average diameter of the sintered particles is within the range of 100 nm to 500 µm. When the average particle diameter is less than 100 nm, the piezoelectric performance is likely degraded due to a size effect, and when the average particle diameter is more than 500 µm, the mechanical strength is likely reduced. The average diameter of the sintered particle is more preferably 200 nm to 200 µm and still more preferably 300 nm to 100 µm.

The relative sintered density of the tungsten bronze structure oxide in the present invention is 85% or more. When the relative sintered density is high, the mechanical quality factor is increased. Thus, the relative sintered density is preferably 90% or more and more preferably 95% or more.

The Curie point of the tungsten bronze structure oxide in the present invention was 77 K (about −200° C.) or more, which is easily achieved by cooling with liquid nitrogen. The Curie point is more preferably −100° C. to 500° C., which is industrially important.

The spontaneous polarization axis direction of the tungsten bronze structure ferroelectrics in the present invention is a [001] direction, and good piezoelectric property is not obtained when [001] is perpendicular to an applied electric field. That is, in order to obtain the large piezoelectric property, the crystal orientation close to (001) orientation rather than (100) or (010) orientation is preferable. The degree of the crystal orientation of the sintered bodies and the films can be evaluated by the Lotgering method or measuring X-ray pole figures. The piezoelectric material of the present invention may be a polycrystal body having no preferential orientation, and may be the crystal having the (001) crystal orientation as described above for improving the characteristics.

Furthermore, a tungsten bronze structure oxide films also grows on (100) $SrTiO_3$ single crystal substrates. The films were predominantly grown with (001) orientation, while small portion of the crystals were grown with (310) orientation. In the (310)-oriented crystals, [001], which is a polarization axis direction, is directed to a horizontal direction. Thus, (310)-oriented crystals hardly contribute to the piezoelectric strain observed along the surface normal direction. That is, the piezoelectric performance of the tungsten bronze structure oxide film on the (100) SrTiO$_3$ substrates depends on the volume ratio of the (001)-oriented crystals and the (310)-oriented crystals, so that the reproducibility of the obtained characteristics is poor. On the contrary, a (421) single orientation is reproducibly obtained on (111) SrTiO$_3$ substrates, and the reproducibility of the physical properties is thus improved.

For the tungsten bronze structure oxide represented by the above general formula (1), $a(A_xB_{10}O_{30})-(1-a)(A'_xB'_{10}O_{30})$, ($0<a<1$, $4 \leq x \leq 6$, $4 \leq x' \leq 6$, and $4 \leq ax+(1-a)x'<6$), it is preferable that the end component tungsten bronze structure oxide represented by $A_xB_{10}O_{30}$ is an orthorhombic crystal. The reason for that is because in order to form the morphotropic phase boundary, it is necessary that the end components of the solid solution system are tetragonal and orthorhombic crystals or are orthorhombic crystals with different space groups. In both cases, it is desirable that one of the end components of the solid solution system is an orthorhombic crystal.

Furthermore, it is desirable that at least one of the tungsten bronze structure oxides represented by $A_xB_{10}O_{30}$ or $A'_xB'_{10}O_{30}$ is a ferroelectric material at room temperature.

When all end components in a solid solution system are paraelectric materials, the resulting solid solution may not have ferroelectricity. Therefore, it is desirable that at least one of the end components is a ferroelectric material at room temperature.

Furthermore, in the tungsten bronze structure oxide represented by $A_xB_{10}O_{30}$ and $A'_xB'_{10}O_{30}$, the total formal charges of the cations is +60 or more and +75 or less.

The composition should be designed to suppress the oxygen defects, which can be the pinning source of the spontaneous polarization and increase the leakage current. When the total formal charges of the cations in the $A_xB_{10}O_{30}$ or $A'_xB'_{10}O_{30}$ falls below +60, the charge valance cannot be maintained in the substance without the oxygen defects. Therefore, it is desirable that the total formal charges of the cations is +60. For example, when the A site is Ba$_4$Ag$_2$ or Ba$_4$Bi$_{2/3}$ and the B site is Nb$_{10}$, the total formal charges of the cations is +60 to be valanced with −60 which is the total formal charges of the oxygen ions. In addition, when the A sites are occupied by (Ba, Sr, Ca)$_5$ and the B sites are occupied by Nb$_{10}$, the total formal charges of the cations becomes +60.

Meanwhile, even if the cation composition is stoichiometric, there is a material in which the oxygen defect easily occurs inherently. In such a case, the oxygen defect is suppressed by partially substituting the cation with an element having a high valence. That is, it is desirable in some cases that the total formal charges of the cations exceed the aforementioned +60.

Furthermore, in a perovskite structure ferroelectric materials and a bismuth layer structure ferroelectric materials, when A site ions are added excessively, the sintered density and the ferroelectric property are further enhanced in some cases.

From the above, it is desirable that the total formal charges of the cations be at least +60 or more.

However, for example, when the cations are added excessively by an amount of 30% or more, an impurity phase is generated, and the piezoelectric performance is degraded. Thus, for the tungsten bronze structure piezoelectric material represented by $A_xB_{10}O_{30}$ and $A'_xB'_{10}O_{30}$, it is desirable that the total formal charges of the cations is +60 or more and +75 or less and preferably +60 or more and +70 or less.

The piezoelectric material of the present invention is a tungsten bronze structure oxide represented by $A_xB_{10}O_{30}$: $b(Ba_{5-5\alpha}Bi_{10\alpha/3}Nb_{10}O_{30})+(1-b)(Ba_4Ag_2Nb_{10}O_{30})$ ($0 \leq b \leq 1$ and $0 < \alpha \leq 0.4$) and $A'_xB'_{10}O_{30}$: $c(Sr_5Nb_{10}O_{30})+d(Ca_5Nb_{10}O_{30})+e(Ba_5Nb_{10}O_{30})$ ($0 \leq c \leq 0.8$, $0 \leq d \leq 0.4$, $0.1 \leq e \leq 0.9$, and $c+d+e=1$).

Furthermore, the piezoelectric material of the present invention is a tungsten bronze structure oxide represented by $A_xB_{10}O_{30}$: $b(Ba_4Bi_{2/3}Nb_{10}O_{30})+(1-b)(Ba_4Ag_2Nb_{10}O_{30})$ ($0<b \leq 1$) and $A'_xB'_{10}O_{30}$: $c(Sr_5Nb_{10}O_{30})+d(Ca_5Nb_{10}O_{30})+e(Ba_5Nb_{10}O_{30})$ ($0 \leq c \leq 0.8$, $0 \leq d \leq 0.4$, $0.1 \leq e \leq 0.9$, and $c+d+e=1$).

Furthermore, the piezoelectric material of the present invention is a tungsten bronze structure oxide represented by $A_xB_{10}O_{30}$: $b(Ba_{5-5\alpha}Bi_{10\alpha/3}Nb_{10}O_{30})+(1-b)(Ba_4Ag_2Nb_{10}O_{30})$ ($0 \leq b \leq 1$ and $0<\alpha \leq 0.4$) and $A'_xB'_{10}O_{30}$: $f\{(Ba_{1-\beta}Sr_\beta)_6(Ti_2Nb_8)O_{30}\}+(1-f)(Ba_{1-\gamma}Ca_\gamma)_6(Ti_2Nb_8)O_{30}\}$ ($0 \leq f \leq 1$, $0 \leq \beta \leq 1$, and $0 \leq \gamma \leq 1$).

EXAMPLES

The present invention is described specifically below with reference to examples.

Example 1

A tungsten bronze structure oxide films represented by $(1-X)Sr_3Ba_2Nb_{10}O_{30}—X(Ba_4Bi_{2/3}Nb_{10}O_{30})$ [hereinafter referred to as (1-X)SBN-XBBN, ($0 \leq X \leq 1$)] were made by a high frequency magnetron sputtering process. A mixed powder of barium carbonate, strontium carbonate, barium oxide, niobium oxide, and bismuth oxide was used for a target. The gas atmosphere in the sputtering process was Ar/O$_2$=20/1, the pressure in the reaction chamber was 0.5 Pa, the growth temperature was about 650° C. to 800° C., and the input electric power was about 32 W/inch$^2$. (111) SrTiO$_3$ single crystals doped with lanthanum were used for a substrate.

Films with a thickness of about 1 μm were grown in a deposition time of about 4 hours. The composition of the film was monitored by evaluating the composition of the film deposited on a Pt/Ti/SiO$_2$/Si substrate under the same growth conditions with wavelength diffusion type X-ray fluorescence calibrated with a standard sample.

It was found that the films were crystallized (1-X)SBN-XBBN and were oriented to (421) in the tetragonal description. There was no other impurity phase, and no crystal orientation other than (421) was detected. From the X-ray pole figure measurements, it was also found that the (421)-oriented films were epitaxially grown on the substrates.

Subsequently, the change in the crystal system from tetragonal to orthorhombic was confirmed by an X-ray reciprocal space mapping. Specifically, a region for diffraction in the orthorhombic description was measured in detail. As shown in FIG. 1, it was found that the crystal system was tetragonal, which is characterized with identical a- and b-axis lattice parameters, in X of 0 to 0.06, whereas the crystal system was orthorhombic, which is characterized with different a- and b-axis lattice parameters, in X ≧ 0.17 at room temperature. Consequently, it was shown that the morphotropic phase boundary existed between 0.06 and 0.17 of X.

A surface of the grown film was covered with a shadow mask having 100 μm holes and Pt upper electrodes were deposited onto the films through the shadow mask holes. A DC sputtering apparatus was used for the formation of Pt. At that time, the sample was not heated intentionally. After forming the Pt upper electrode, annealing at 400° C. at atmospheric pressure in an oxygen atmosphere for 30 minutes was carried out for improving the adhesion between the film and the upper electrode.

Figure 2:
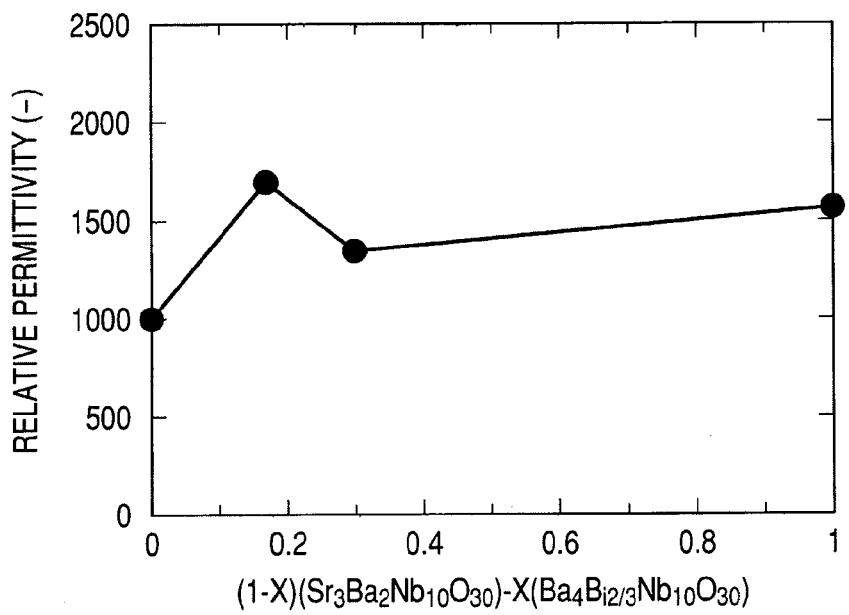
FIG. 2 is a graphical representation illustrating the relative permittivity of the (1-X)$Sr_3Ba_2Nb_{10}O_{30}$—X($Ba_4Bi_{2/3}Nb_{10}O_{30}$) thin films at 80K.

The above sample was set in a vacuum chamber and cooled down to 80 K. A movable probe was provided in the vacuum chamber, and the capacitance was measured using an impedance analyzer. The frequency and the magnitude of the small AC field were 1 MHz and 20 mV, respectively. To evaluate the film thickness, the sample was broken, and its cross-section was observed with a scanning electron microscope. For each samples, more than 3 points were observed to obtain the average film thickness. The relative permittivity was calculated from the capacitance and the film thickness obtained as described above. As shown in FIG. 2, it was found that the relative permittivity at 80 K had a maximum value at X=0.17. This composition is included into the composition of the morphotropic phase boundary in 0.06 to 0.17 of X obtained from the structural analysis.

Figure 3:
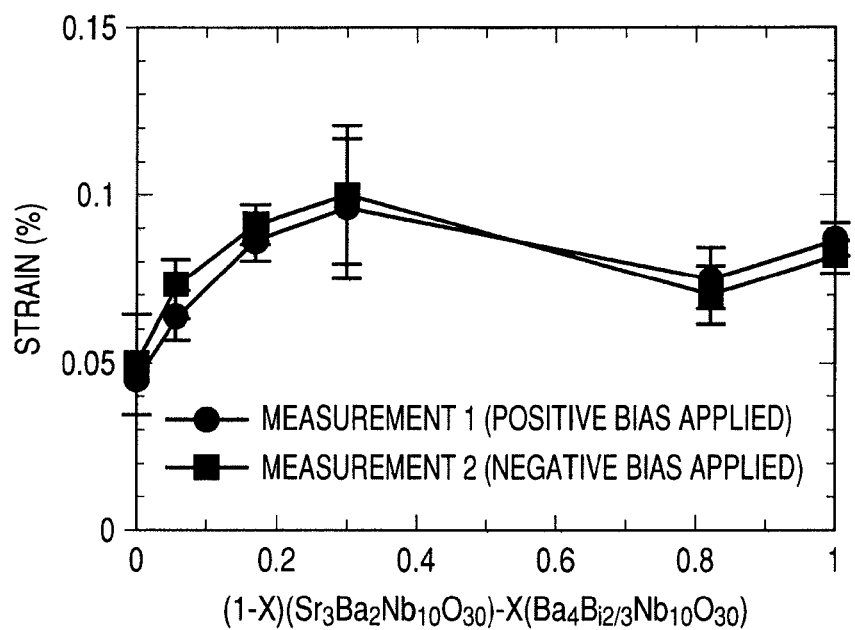
FIG. 3 is a graphical representation illustrating the piezoelectric strain of the (1-X)$Sr_3Ba_2Nb_{10}O_{30}$—X($Ba_4Bi_{2/3}Nb_{10}O_{30}$) thin films at 80K.

At the same 80 K, the upper electrode, which was in contact with the probe, was irradiated with laser, and the vertical displacement under an electric field was evaluated using a laser Doppler vibration meter. The frequency of the applied voltage was 100 kHz. The piezoelectric material exhibited a maximum value of the piezoelectric strain in the range of 0.17 to 0.3 of X as shown in FIG. 3. This composition is nearly identical to the composition of the morphotropic phase boundary in 0.06 to 0.17 of X obtained from the structural analysis.

In the present measurement, a polarization switching of the ferroelectric material was also measured simultaneously in addition to the measurement of the displacement by the laser Doppler vibration meter. In this measurement, it has been found empirically that the coercive fields are different for polarization-electric field (P-E) hysteresis curves and strain-electric field (S-E) hysteresis curves, when the resistivity of the sample is low. This phenomenon was significantly observed for both end component materials at 0 and 1 of X. That is, in FIG. 3, the strain at X=1.0 exhibits a practically high value, while it has been found that the resistivity of the samples at X=1.0 is low and this composition is an unfavorable one. This is believed to correspond to the low relative sintered density of the samples at X=0 and 1 compared with the samples at 0<X<1. The composition dependence of the relative sintered density will be described in Example 2 below.

Figure 4:
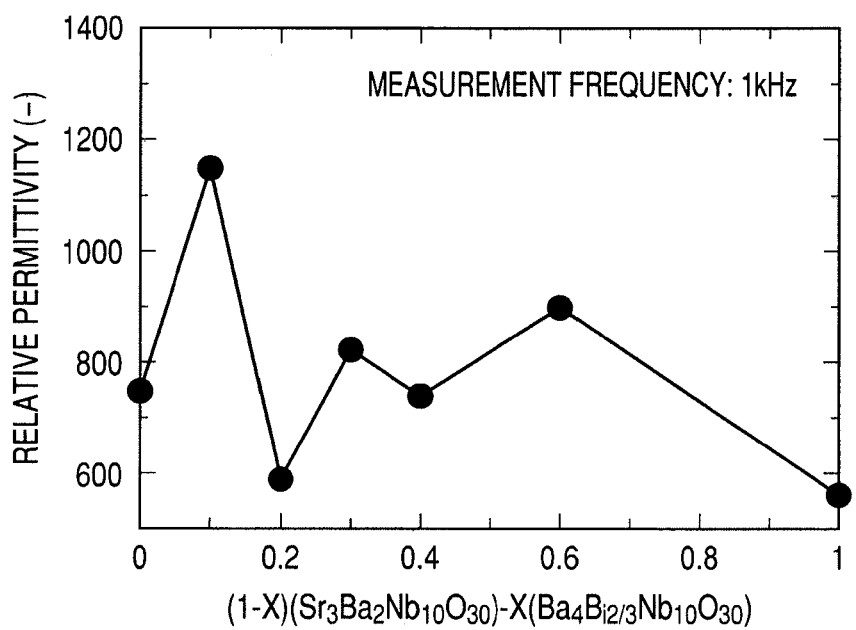
FIG. 4 is a graphical representation illustrating the relative permittivity of the (1-X)$Sr_3Ba_2Nb_{10}O_{30}$—X($Ba_4Bi_{2/3}Nb_{10}O_{30}$) sintered bodies at −100° C.

The relative permittivities of the sintered bodies measured at −100° C. is shown in FIG. 4. It has been confirmed that all Curie temperatures of the samples are higher than −100° C. The relative permittivity is higher at X=0.1 than those at the other compositions, indicating that the morphotropic phase boundary exists near X=0.1. This result is consistent with the results shown in FIG. 2, which also indicate an anomaly in the relative dielectric constant at X=0.17.

Example 2

Sintered bodies of the tungsten bronze structure (1-X)SBN-XBBN ($0 \leqq X \leqq 1$) were made. Powders of barium carbonate, strontium carbonate, barium oxide, niobium oxide, and bismuth oxide were used as the raw materials, and dry-mixing was performed at a predetermined mixing ratio. Calcination was carried out at 950 to 1,100° C. in the air atmosphere for 5 hours.

For molding, the powder obtained by the calcination was pulverized in a mortar, then 3 wt % polyvinyl butyral (PVB) was added as a binder, stirred, and mixed, and subsequently, the powder obtained by drying was molded into a pellet of 17 mm in diameter by using a pellet molding machine and applying a pressure at 70 MPa for 3 minutes. Furthermore, by an isotropic pressing machine, the pellets were isotropically pressed at 200 MPa for 5 minutes.

The pellets were sintered at 1,300 to 1,350° C. in the air ambient for 2 hours using an electric furnace. The resulting sintered pellet was polished up to a thickness of 1 mm, an Au electrode was formed using a sputtering apparatus, and the pellet was cut into pieces of 2.5 mm×10 mm using a cutting apparatus for the subsequent characterizations of the electrical properties.

The density of the resulting sintered body was measured by Archimedes's method, and its relative sintered density was evaluated. The relative sintered density was 75 to 90% at X=0 and 1, but was 90% or more in the composition other than them.

Any of the resulting (1-X)SBN-XBBN ($0 \leqq X \leqq 1$) sintered bodies were consisted of a single phase of the tungsten bronze structure. However, in the sample in which Nb had been added excessively by more than 30%, an impurity phase such as $Nb_2O_5$ was observed after the sintering.

The relationship between the composition X and the relative sintered density of the tungsten bronze structure (1-X)SBN-XBBN ($0 \leqq X \leqq 1$) sintered bodies is shown in Table 1.

TABLE 1

| X | Relative sintered density (%) |
|---|---|
| 0 | 78.3 |
| 0.1 | 90.4 |
| 0.2 | 92.5 |
| 0.3 | 96.0 |
| 0.4 | 94.7 |
| 1.0 | 86.5 |

In order to characterize a piezoelectric property of a bulk ceramic sample by a resonance antiresonance method, it is necessary to carry out poling treatment that aligns the polarization direction by applying a high DC field to the sample prior to the characterization. However, it has been found empirically that the sample having low density easily undergoes dielectric breakdown by applying a high electric field and the polarization treatment can not be completed. The samples of the examples at X=0 and 1 had low resistivity due to their low density. Thus, the electric field large enough to complete the poling treatment could not be applied to the samples.

SBN and BBN, which were the end components in this solid solution system, were ferroelectric materials at room temperature. The particle diameters of the sintered bodies were about 0.3 to 500 μm. When the sintering conditions were changed and crystal particle diameters exceeded 500 μm, the sintered body was inferior in strength upon cutting process and polishing process.

Example 3

Using barium carbonate, bismuth oxide, and niobium oxide as the raw materials, $(Ba_4Bi_{2/3})Nb_{10}O_{30}$ was made as the particles A, and using barium carbonate, strontium carbonate, calcium carbonate, and niobium oxide as the raw materials, $c(Sr_5Nb_{10}O_{30})+d(Ca_5Nb_{10}O_{30})+e(Ba_5Nb_{10}O_{30})$ was made as the particles B. Next, the particles A and the particles B were mixed to make sintered bodies of various compositions. Sintered bodies having a density of 95% or more were obtained at sintering temperatures of 1,250° C. to 1,400° C. It was confirmed that these samples had high relative permittivity and good piezoelectric property. Furthermore, $Ba_4Ag_2Nb_{10}O_{30}$ was made using silver nitride as a raw material powder, and a part of the particles A was substituted with $Ba_4Ag_2Nb_{10}O_{30}$. Thereby, it was confirmed that the sintering temperature can be decreased to about 1,150° C., and that the production costs can be more reduced.

Example 4

Using barium carbonate, bismuth oxide, silver nitrate, and niobium oxide as the raw materials, particles C having the composition of $0.8\{(Ba_4Bi_{2/3})Nb_{10}O_{30}\}-0.2(Ba_4Ag_2Nb_{10}O_{30})$ was made. Using barium carbonate, titanium oxide, and niobium oxide as the raw materials, particles D having the composition of $Ba_6(Ti_2Nb_8)O_{30}$ was made.

The particles C and the particles D were mixed at various mixing ratios to produce sintered bodies having different compositions. Good sintered bodies having a sintered density of 95% or more were obtained at sintering temperature of 1,150° C. to 1,400° C. It was confirmed that by changing the composition, there was a composition region in which the relative permittivity and the piezoelectric property were enhanced.

Comparative Example 1

Using strontium carbonate, titanium oxide, and niobium oxide as the raw materials, particles E having the composition of $Sr_6Ti_2Nb_8O_{30}$ was made. Using barium carbonate, titanium oxide, and niobium oxide as the raw materials, particles F having the composition of $Ba_6Ti_2Nb_8O_{30}$ was made.

The particles E and the particles F were mixed at various mixing ratios to produce sintered bodies, $(Ba,Sr)_6Ti_2Nb_8O_{30}$, having different compositions. Good sintered bodies having a sintered density of 95% or more were obtained at sintering temperature of 1,150° C. to 1,400° C. It was confirmed that the relative permittivity was maximized near the composition of $(Ba_{1/3}Sr_{2/3})_6Ti_2Nb_8O_{30}$. However, the piezoelectric property of $(Ba_{1/3}Sr_{2/3})_6Ti_2Nb_8O_{30}$ in which the two elements of Ba and Sr occupied the all A sites was inferior to the piezoelectric property of $Ba_6Ti_2Nb_8O_{30}$.

The present invention is not limited by the above examples.

In the examples, the data were partially obtained at 80 K, but the same effects can be obtained even at room temperature by combining the elements in the present invention.

In the case where an orthorhombic material (including a pseudo tetragonal material) is used as above mentioned $A_xB_{10}O_{30}$, for example, $A_xB_{10}O_{30}$ is chosen from $Ba_{5-5\alpha}Bi_{10\alpha/3}Nb_{10}O_{30}$ ($0<\alpha\leq0.4$) and $Ba_4Ag_2Nb_{10}O_{30}$.

In the case where a tetragonal material is used as above mentioned $A'_xB'_{10}O_{30}$, for example, $A'_xB'_{10}O_{30}$ is selected from $(Sr_{1+3z}Ba_{5-3z})B^V_{10}O_{30}$ ($0\leq z\leq 1$) ($B^V$=Nb, Ta, or the like), $(Ca_{1+z}Ba_{4-z})B^V_{10}O_{30}$, $(Sr, Ca, Ba)B^V_{10}O_{30}$, $A_4Ag_2B^V_{10}O_{30}$ (A=Sr, Ca, Ba, or the like), $A_6B^{III}_{2/3}B^V_{28/3}O_{30}$ ($B^{II}$=Co, Ni, Cu, Mg, Fe, or the like), $A_6B^{III}_2B^V_9O_{30}$ ($B^{III}$=Sc, Cr, Mn, Fe, Ga, In, or the like), $A_6B^{IV}_2B^V_8O_{30}$ ($B^{IV}$=Fe, Zr, Sn, Hf, Ti, or the like), $A_4Ln_2B^{II}_2B^V_8O_{30}$ (Ln=La, Nd, Sm, Bi, Gd, Ce, Yb, or the like), $A_2Ln_4B^{III}_3B^V_7O_{30}$, $A_5LnB^{IV}_3B^V_7O_{30}$, $A_4Ln_2B^{IV}_4B^V_6O_{30}$, $Ln_6B^{III}_4B^V_6O_{30}$, $Ag_6W_4B^V_6O_{30}$, and $A_3Ln_3B^{IV}_5B^V_5O_{30}$.

A, $B^{II, III, IV, V}$, and Ln included in the above chemical formulas represent the elements, which give an appropriate charge balance to and have an appropriate ionic radius in the tungsten bronze structure, and are the favorable elements.

The piezoelectric material of the present invention has good piezoelectric characteristics and is free of lead and alkali metal, and thus, can be utilized for inkjet printers and ultrasonic motors.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-196902, filed Jul. 30, 2008, which is hereby incorporated by reference herein in its entirety.

What is claimed is:

1. A piezoelectric material comprising a tungsten bronze structure oxide represented by the general formula (I):

$$a(A_xB_{10}O_{30})-(1-a(A'_xB'_{10}O_{30}),$$

wherein A comprises at least barium and bismuth and may further comprise alkali earth metals, silver, and combinations thereof; A' comprises at least strontium and barium and may further comprise at least one element selected from Group II elements, Group III elements (including lanthanoid), bismuth, and silver; B and B' comprise at least niobium and may further comprise at least one element selected from magnesium, transition elements in Group III to Group XI, zinc, metal elements in Group XIII, and tin; and a represents 0.06<a<0.8, x represents $4\leq x\leq 6$, and x' represents $4\leq x'\leq 6$ and $4\leq ax+(1-a)x'<6$, and wherein the tungsten bronze structure oxide represented by $A_xB_{10}O_{30}$ is an orthorhombic crystal.

2. The piezoelectric material according to claim 1, wherein at least one of the tungsten bronze structure oxide represented by $A_xB_{10}O_{30}$ and the tungsten bronze structure oxide represented by $A'_xB'_{10}O_{30}$ is a ferroelectric material at room temperature.

3. The piezoelectric material according to claim 1, wherein the total formal charges of the cations is +60 or more and +75 or less in the tungsten bronze structure oxide represented by $A_xB_{10}O_{30}$ and $A'_xB'_{10}O_{30}$.

4. The piezoelectric material according to claim 1, wherein the $A_xB_{10}O_{30}$ is $Ba_4Bi_{2/3}Nb_{10}O_{30}$ and the $A'_xB'_{10}O_{30}$ is $Sr_3Ba_2Nb_{10}O_{30}$.

5. The piezoelectric material according to claim 1, wherein the metal oxide forms a morphotropic phase boundary.

6. The piezoelectric material according to claim 1, wherein the $A_xB_{10}O_{30}$ is $b(Ba_{5-5\alpha}Bi_{10\alpha/3}Nb_{10}O_{30})+(1-b)(Ba_4Ag_2Nb_{10}O_{30})$ ($0<b\leq 1$, $0<\alpha\leq 0.4$), and the $A'_xB'_{10}O_{30}$ is $c(Sr_5Nb_{10}O_{30})+d(Ca_5Nb_{10}O_{30})+e(Ba_5Nb_{10}O_{30})$ ($0<c\leq 0.8$, $0\leq d\leq 0.4$, $0.1\leq e\leq 0.9$, and c+d+e=1).

7. The piezoelectric material according to claim 6, wherein α is 0.2.

8. The piezoelectric material according to claim 1, wherein the tungsten bronze structure oxide represented by $A_xB_{10}O_{30}$ is $b(Ba_{5-5\alpha}Bi_{10\alpha/3}Nb_{10}O_{30})+(1-b)(Ba_4Ag_2Nb_{10}O_{30})$ ($0<b\leq 1$, $0<\alpha\leq 0.4$), and in the tungsten bronze structure oxide represented by $A'_xB'_{10}O_{30}$, A' represents a combination of Sr, Ba, and optionally Ca, B' represents $Ti_{0.2}Nb_{0.8}$, and x' represents 6.

* * * * *